(12) United States Patent
Inada et al.

(10) Patent No.: US 7,344,600 B2
(45) Date of Patent: Mar. 18, 2008

(54) SUBSTRATE TREATMENT APPARATUS

(75) Inventors: Hiroichi Inada, Koshi-Machi (JP); Naofumi Kishita, Koshi-Machi (JP)

(73) Assignee: Tokyo Electron Limited, Tokyo (JP)

( * ) Notice: Subject to any disclaimer, the term of this patent is extended or adjusted under 35 U.S.C. 154(b) by 199 days.

(21) Appl. No.: 10/511,104

(22) PCT Filed: Dec. 27, 2002

(86) PCT No.: PCT/JP02/13854

§ 371 (c)(1),
(2), (4) Date: Oct. 14, 2004

(87) PCT Pub. No.: WO03/092055

PCT Pub. Date: Nov. 6, 2003

(65) Prior Publication Data
US 2005/0145168 A1   Jul. 7, 2005

(30) Foreign Application Priority Data
Apr. 26, 2002   (JP) .............................. 2002-126972

(51) Int. Cl.
*B05C 5/00* (2006.01)
(52) U.S. Cl. ........................................ 118/321; 118/52
(58) Field of Classification Search ................ 118/323, 118/321, 315, 52; 427/425
See application file for complete search history.

(56) References Cited

U.S. PATENT DOCUMENTS 6,357,938 B1   3/2002   Noh et al.

(Continued)

FOREIGN PATENT DOCUMENTS

JP   10-106932   4/1998

(Continued)

OTHER PUBLICATIONS

International Preliminary Examination Report (PCT/IPEA/409) (translated) issued for PCT/JP2002/013854, Dec. 2004.

(Continued)

*Primary Examiner*—Brenda A. Lamb
(74) *Attorney, Agent, or Firm*—Smith, Gambrell & Russell, LLP

(57) ABSTRACT

Dislocation of processing liquid pouring nozzles is prevented, smooth carrying of the processing liquid pouring nozzles is achieved, and the positional accuracy of the processing liquid pouring nozzles, processing accuracy and yield are improved. A substrate processing apparatus includes a spin chuck (50) for holding and rotating a wafer (W), a plurality of processing liquid pouring nozzles (60) for pouring processing liquids on a surface of the wafer (W), a solvent bath (70) for holding the processing liquid pouring nozzles at their home positions, and a nozzle-carrying arm (80) for detachably gripping desired one of the processing liquid pouring nozzles (60) held on the solvent bath (70) and carrying the desired processing liquid pouring nozzle (60) to a working position above the wafer (W). The processing liquid pouring nozzles (60) are held in alignment with straight lines (L) extending between the center (C) of the spin chuck (50) about which the spin chuck (50) rotates and nozzle holding openings (71) formed at suitable intervals in the solvent bath (70), respectively, and flexible supply tubes (61) connecting the processing liquid pouring nozzles (60) to processing liquid sources are arranged on extensions of the straight lines (L) respectively.

18 Claims, 12 Drawing Sheets

U.S. PATENT DOCUMENTS

2002/0043214 A1    4/2002    Inada et al.

FOREIGN PATENT DOCUMENTS

| | | |
|---|---|---|
| JP | 10-137665 | 5/1998 |
| JP | 10-256127 | 9/1998 |
| JP | 2000-012417 | 1/2000 |
| JP | 2000-353654 | 12/2000 |
| JP | 2001-176793 | 6/2001 |
| JP | 2002-198304 | 7/2002 |

OTHER PUBLICATIONS

Notification of Transmittal of Copies of Translation of the International Preliminary Examination Report (PCT/IB/338) issued for PCT/JP2002/013854, Oct. 2004.

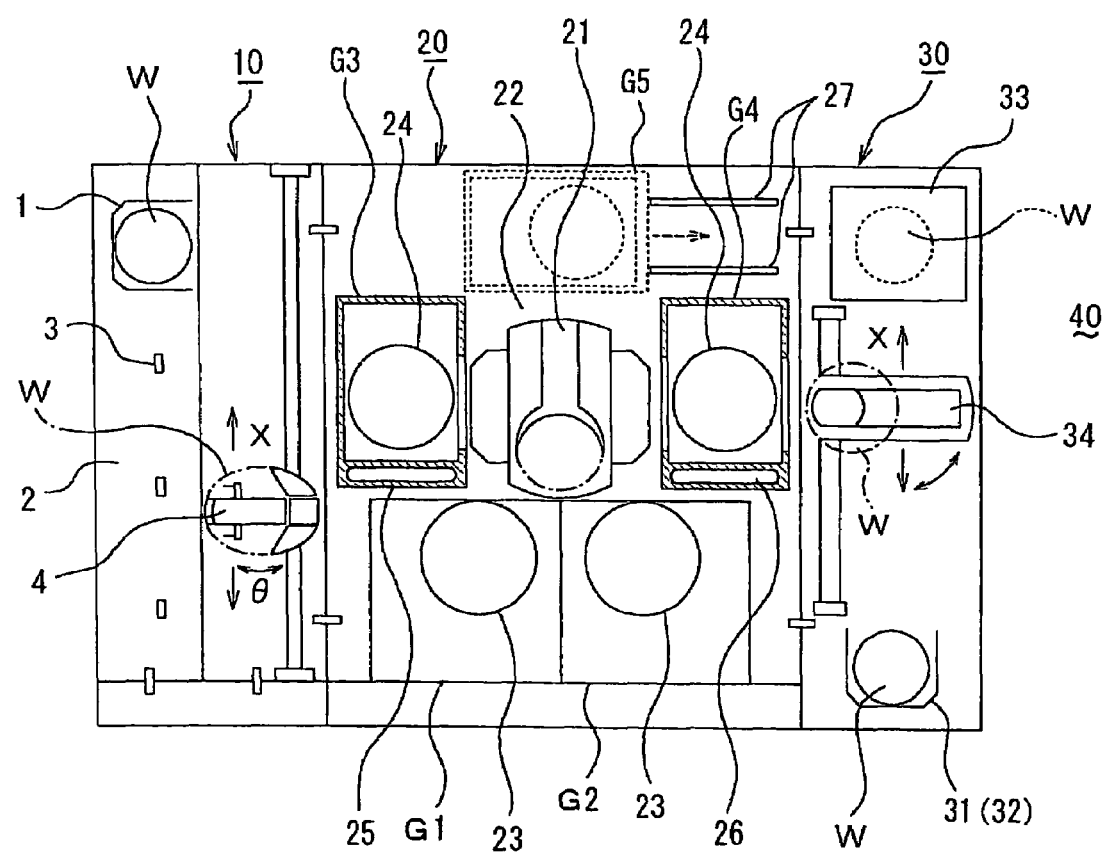
F I G. 1

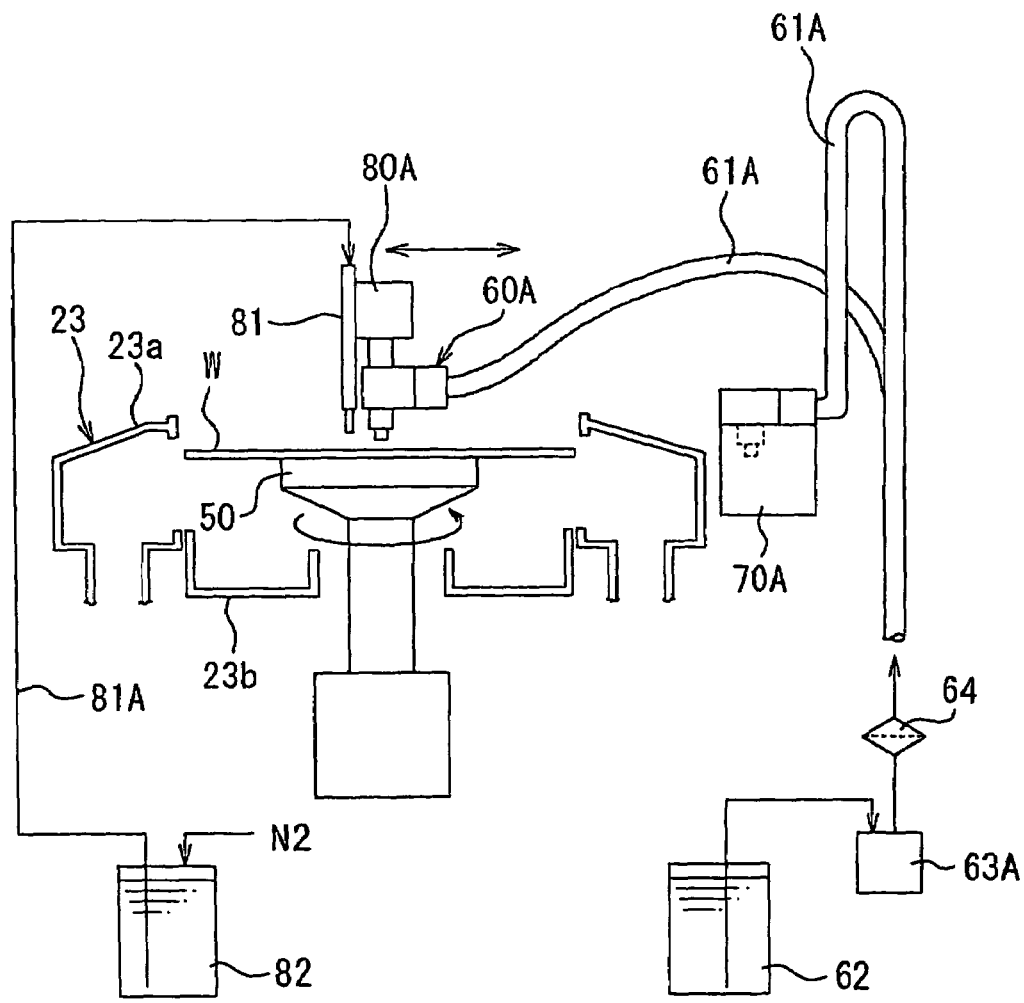
F I G. 12

SUBSTRATE TREATMENT APPARATUS

TECHNICAL FIELD

The present invention relates to a substrate processing apparatus, such as a substrate processing apparatus that processes a substrate, such as a semiconductor wafer or a LCD substrate, with different kinds of processing liquids while the substrate is being rotated.

BACKGROUND ART

Generally, a semiconductor device fabricating process uses photolithography for forming a resist pattern on the surface of a substrate to be processed, such as a semiconductor wafer or a LCD substrate. Photolithography includes a resist film forming process for forming a resist film on a surface of a substrate, an exposure process for transferring a circuit pattern to the resist film by exposing the resist film, and a developing process for processing the exposed resist film formed on the substrate with a developer.

The resist film forming process drops a solvent capable of dissolving a resist on the surface of a rotating substrate to form a solvent film and drops a resist solution on the surface of the substrate to form a resist film on the surface of the substrate. Different types of resist solutions meeting the purpose are used to form a plurality of resist films in layers.

Referring to FIGS. 11 and 12, a conventional resist film forming apparatus includes a spin chuck 50 capable of holding a substrate, such as a semiconductor wafer W (hereinafter referred to simply as "wafer W") and of rotating, ten processing liquid pouring nozzles 60A for pouring resist solutions, namely, processing liquids, onto a surface of the wafer W held on the spin chuck 50, a solvent bath 70A holding the processing liquid pouring nozzles 60A at their home positions at intervals in a row beside the spin chuck 50, and a nozzle-carrying arm 80A for detachably gripping desired one of the processing liquid pouring nozzles 60a held on the solvent bath 70A to a position above the wafer W. The nozzle-carrying arm 80A holds a solvent pouring nozzle 81 for dropping a solvent capable of dissolving a resist on the wafer W. A space extending around and under the spin chuck 50 and the wafer W held on the spin chuck 50 are surrounded by a cup 23 consisting of an outer cup 23a and an inner cup 23b. Mist of the resist solution splashed about by the wafer W during the resist film forming processis caught by the cup 23. A nozzle rest 91 is disposed opposite to the solvent bath 70A. A rinsing liquid pouring nozzle 90 rests on the nozzle rest 91.

In the substrate processing apparatus thus constructed, each of the processing liquid pouring nozzles 60A is connected to a resist solution tank 62 by a flexible supply tube 61A. The supply tube 61A has a length sufficient for the processing liquid pouring nozzle 60A to move between the home position on the solvent bath 70A and a working position above the center C of the spin chuck 50. When the processing liquid pouring nozzle 60A is held at the home position, the supply tube 61 is curved upward convexly as shown in FIG. 12. A pump 63A and a filter 64 are placed in the supply tube 61A. The pump 63A pumps the resist solution to pour a predetermined quantity of the resist solution. The solvent pouring nozzle 81 is connected to a solvent tank 82 by a flexible solvent supply tube 81A. A solvent contained in the solvent tank 82 is supplied by pressure to the solvent pouring nozzle 81 by the pressure of $N_2$ gas supplied into the solvent tank 82. As shown in FIG. 11 or 12, each of the supply tube 61A has one end connected to the processing liquid pouring nozzle 60A and the other end fixed to a resist solution tank 62. As shown in FIG. 12, the processing liquid pouring nozzle 60A carried to a working position above the wafer W by the nozzle-carrying arm 80A is connected to the resist solution tank 62 by the supply tube 61A.

Referring to FIG. 11, the nozzle-carrying arm 80A is capable of moving only in lateral directions along a Y-axis in a horizontal plane. When the desired processing liquid pouring nozzle 60A needs to be carried to the working position above the wafer W by the nozzle-carrying arm 80A, the solvent bath 70A is moved longitudinally along an X-axis, i.e., in a vertical direction as viewed in FIG. 11, to position the desired processing liquid pouring nozzle 60A at a position where the desired processing liquid pouring nozzle 60A can be gripped by the nozzle-carrying arm 80A, and then, the nozzle-carrying arm 80A is moved laterally along the Y-axis to grip the processing liquid pouring nozzle 60A.

In this conventional substrate processing apparatus, the processing liquid pouring nozzles 60A arranged in a straight row are held by the solvent bath 70A. Therefore, the supply tubes 61A connected to the adjacent processing liquid pouring nozzle 60A interfere with the supply tube 61A connected to the processing liquid pouring nozzle 60A disposed at the end of the row when the processing liquid pouring nozzle 60A disposed at the end of the row is used. Consequently, the movement of the processing liquid pouring nozzle 60A is obstructed and the other processing liquid pouring nozzles 60A are dislocated. When the processing liquid pouring nozzle 60A is located, the same processing liquid pouring nozzle 60A cannot be accurately positioned at the working position and, consequently, processing accuracy is deteriorated and the yield of the process is reduced.

If the dislocated processing liquid pouring nozzle 60A is carried to the working position and is returned to the home position on the solvent bath 70A by the nozzle-carrying arm 80A, it is possible that the resist remaining in the mouth of the processing liquid pouring nozzle 60A dries up because the processing liquid pouring nozzle 60A is held at a wrong position. When an ArF resist, which is apt to dry up, is used, scrupulous care must be taken to prevent the resist from drying.

Since the nozzle-carrying arm 80A is able to move only laterally along the Y-axis in a horizontal plane, the nozzle-carrying arm 80A cannot be accurately positioned at a gripping position where the nozzle-carrying arm 80A grips the processing liquid pouring nozzle 60A and, consequently, the nozzle-carrying arm 80A holds the processing liquid pouring nozzle 60A in an inclined position in some cases. If the processing liquid pouring nozzle 60A is dislocated, the processing liquid pouring nozzle 60A cannot be accurately positioned at the working position, processing accuracy is deteriorated and the yield of the process is reduced.

DISCLOSURE OF THE INVENTION

The present invention has been made in view of the foregoing circumstances and it is therefore an object of the present invention to provide a substrate processing apparatus capable of preventing the dislocation of processing liquid pouring nozzles, of smoothly carrying the processing liquid pouring nozzle, of accurately positioning the processing liquid pouring nozzle, of improving the positional accuracy of the processing liquid pouring nozzles, and of improving yield.

A substrate processing apparatus according to the present invention includes:
- a rotary workpiece-holding means for holding and rotating a substrate;
- a plurality of processing liquid pouring nozzles for pouring processing liquids on a surface of the substrate held by the rotary workpiece-holding means;
- a nozzle-holding means for holding the processing liquid pouring nozzles at their home positions beside the rotary workpiece-holding means; and
- a nozzle carrying means for detachably gripping desired one of the processing liquid pouring nozzles held on the nozzle-holding means, and carrying the desired processing liquid pouring nozzle to a working position above the substrate;
- wherein the processing liquid pouring nozzles are held in alignment with straight lines extending between the center of the rotary workpiece-holding means about which the rotary workpiece-holding means rotates and nozzle holding openings formed at suitable intervals in the nozzle-holding means, respectively, and flexible supply tubes connecting the processing liquid pouring nozzles to processing liquid sources are arranged on extensions of the straight lines, respectively.

The nozzle carrying means grips the processing liquid pouring nozzle and carries the liquid pouring nozzle along the straight line extending between the center of the rotary workpiece-holding means and the nozzle holding opening of the nozzle-holding means. Therefore, the supply tubes do not interfere with each other and hence the processing liquid pouring nozzle can be smoothly moved between the home position and the working position. Consequently, the processing liquid pouring nozzles can be prevented from being dislocated, the positional accuracy of the processing liquid pouring nozzles can be improved, processing accuracy and yield can be improved.

In the substrate processing apparatus according to the present invention, it is preferable that the nozzle-holding means is provided with angular position determining walls disposed adjacently to the nozzle holding openings such that sides of the nozzle heads of the processing liquid pouring nozzles are contiguous with the angular position determining walls, respectively.

The processing liquid pouring nozzles are held on the nozzle-holding means with the side surfaces of the nozzle heads thereof in contact with the angular position determining walls. Therefore, the processing liquid pouring nozzles will not be accidentally moved and the dislocation of the processing liquid pouring nozzles from their home positions can be further surely prevented.

Preferably, the nozzle-holding means includes horizontal movement inhibiting members that engage with the opposite side surfaces of the processing liquid pouring nozzles, and each of the processing liquid pouring nozzles has vertical movement inhibiting projections that engage with the opposite ends of the horizontal movement inhibiting member. Preferably, the horizontal movement inhibiting members are provided with attractive fixating means for fixedly holding the processing liquid pouring nozzles in place, and the processing liquid pouring nozzles are provided with plates at positions respectively corresponding to the attractive fixating means.

The horizontal movement inhibiting members engage with the side surfaces of the processing liquid pouring nozzles to restrain the processing liquid pouring nozzles from horizontal movement on the nozzle-holding means. The vertical movement inhibiting projections of the processing liquid pouring nozzles engages with the opposite ends of the horizontal movement inhibiting members to restrain the processing liquid pouring nozzle from vertical movement, i.e., vertical separation from the nozzle-holding means. Since the horizontal movement inhibiting members are provided with the attractive fixating means for fixedly holding the processing liquid pouring nozzles in place, and the processing liquid pouring nozzles are provided with the plates respectively corresponding to the attractive fixating means to hold the processing liquid pouring nozzles fixedly in place by attracting the plates by the attractive fixating means, the processing liquid pouring nozzles can be securely held in place and thereby the dislocation of the processing liquid pouring nozzles can be surely prevented.

The nozzle carrying means is movable in optional directions in a horizontal plane parallel to the surface of the substrate.

Thus the nozzle carrying means is able to grip the accurately positioned processing liquid pouring nozzle, the processing liquid pouring nozzle will not be gripped in an inclined position, the dislocation of the processing liquid pouring nozzles can be prevented, and the positional accuracy of the processing liquid pouring nozzles, processing accuracy and yield can be improved.

Preferably, the processing liquid pouring nozzles are provided in their upper surfaces with a gripping recess with which a gripper included in the nozzle carrying means is able to engage, and a positioning recess with which a positioning pin attached to the nozzle carrying means at a position adjacent to the gripper is able to engage.

When the gripper of the nozzle carrying means grips the processing liquid pouring nozzle, the gripper engages in the gripping recess, and the positioning pin engages in the positioning recess. Consequently, the processing liquid pouring nozzle can be always gripped and held by the nozzle carrying means in a fixed position. Thus, the positional accuracy of the processing liquid pouring nozzle at the home position and the working position can be improved, and the processing liquid pouring nozzle can be smoothly carried.

The gripping recesses and the positioning recesses of the processing liquid pouring nozzles are formed such that lines connecting the respective gripping recesses and the respective positioning recesses of the processing liquid pouring nozzles are parallel to each other.

Thus the gripper of the nozzle carrying means is able to engage surely in the gripping recess, and the positioning pin is able to engage surely in the positioning recess.

Preferably, a solvent vapor atmosphere producing space in which a solvent is stored and a solvent vapor atmosphere is produced is formed in the nozzle-holding means so as to communicate with the nozzle holding openings of the nozzle-holding means, the lower end of a drain line connected to the nozzle holding openings and extending downward is disposed in a sump formed in the bottom wall of a drain/exhaust duct, and drained liquid flowing through the drain line and overflowing the sump is discharged. More preferably, the drain/exhaust duct is connected to a discharge port formed in the bottom of a vessel surrounding a space extending around and under the rotary workpiece-holding means, and the bottom of the drain/exhaust passage is sloped.

Since the pouring orifices of the processing liquid pouring nozzles as held in place on the nozzle-holding means can be kept in the solvent vapor atmosphere capable of dissolving the processing liquid, the processing liquids remaining in the processing liquid pouring nozzles held at their home positions will not dry. The drained processing liquid can flow through the drain line into the drain/exhaust passage, and a sealing mechanism sealing an overflow part of the sump is able to prevent the reverse flow of the drained processing liquid and exhaust gases. Since the drain-exhaust duct is connected to the discharge port formed in the bottom of the vessel surrounding a space extending around and under the rotary workpie ce-holding means, and the bottom of the drain/exhaust passage is sloped, the processing liquids drained from the processing liquid pouring nozzles held on the nozzle-holding means, the processing liquids used for processing and the waste gases can be discharged through the drain/exhaust duct.

BRIEF DESCRIPTION OF THE DRAWINGS

FIG. 1 is a schematic plan view of a patterned resist film forming system including a substrate processing apparatus in a preferred embodiment according to the present invention;

FIG. 12 is a schematic sectional view of the conventional substrate processing apparatus.

BEST MODE FOR CARRYING OUT THE INVENTION

A substrate processing apparatus in a preferred embodiment according to the present invention will be described with reference to the accompanying drawings as applied to a patterned resist film forming system.

Figure 2:
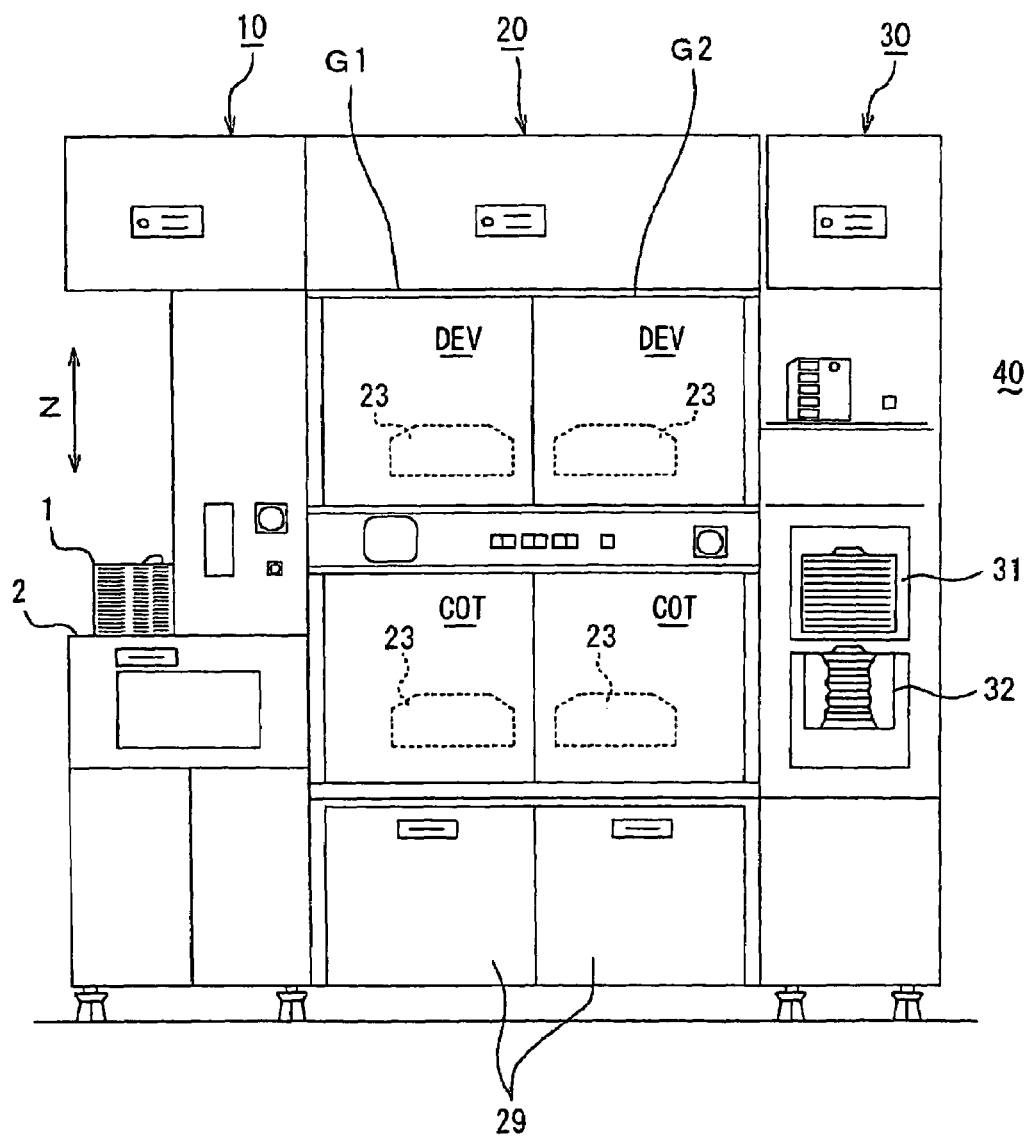
FIG. 2 is a schematic front elevation of the patterned resist film forming system shown in FIG. 1.
Figure 3:
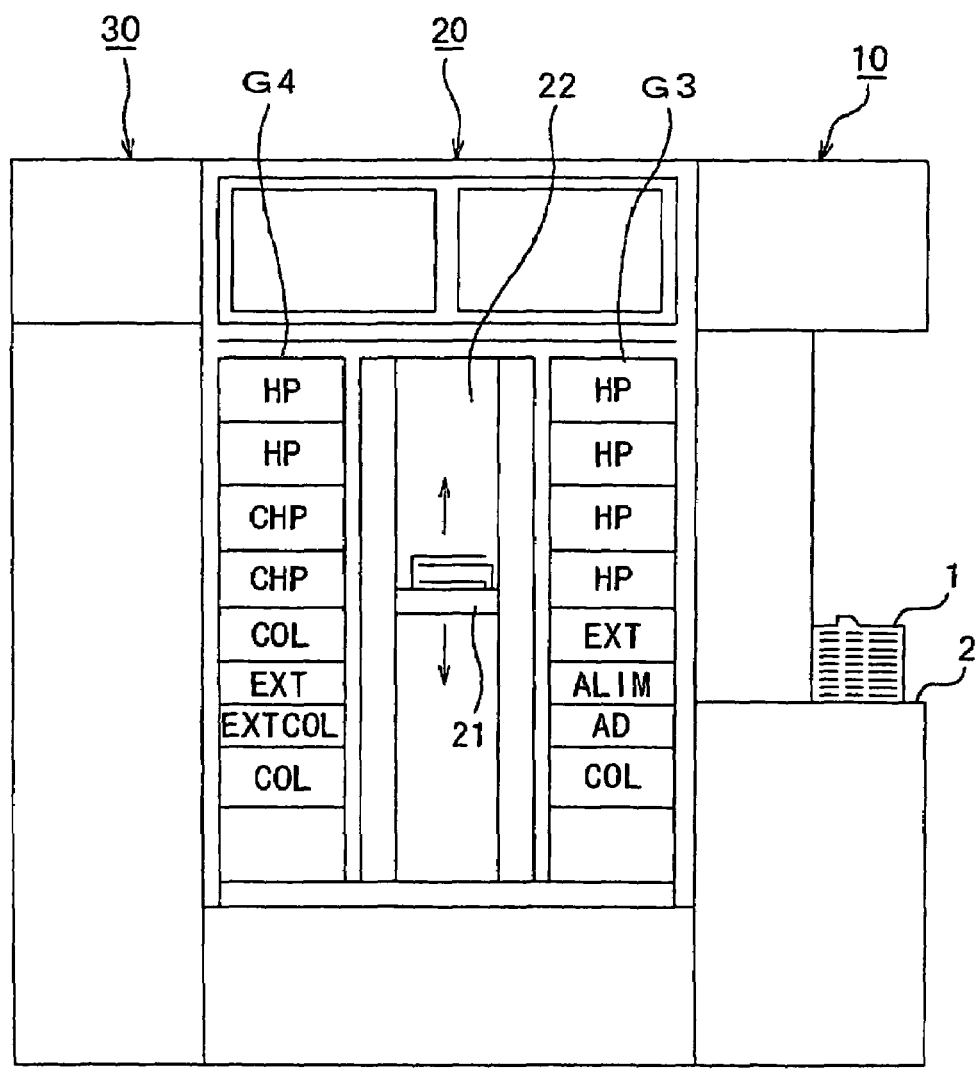
FIG. 3 is a schematic rear view of the patterned resist film forming system shown in FIG. 1.

FIG. 1 is a schematic plan view of a patterned resist film forming system including a substrate processing apparatus in a preferred embodiment according to the present invention, FIG. 2 is a front elevation of the patterned resist film forming system shown in FIG. 1, and FIG. 3 is a rear view of the patterned resist film forming system shown in FIG. 1

The patterned resist film forming system includes, as principal units, a cassette station (transfer unit) 10 where a wafer cassette 1 containing, for example, twenty-five semiconductor wafers (hereinafter referred to simply as "wafers") W, namely, substrates to be processed, from an external system and sending out a cassette 1 containing wafers W, a processing station 20 including various processing units of a single wafer processing system for subjecting wafers W one at a time to predetermined processes, and an interface unit 30 installed contiguously with the processing station 20 to transfer a wafer W to and receiving the wafer W from an exposure apparatus, not shown.

Referring to FIG. 1, the cassette station 10 has a cassette table 2 provided with projections 3. For example, four wafer cassettes 1 at a maximum can be arranged at positions corresponding to the projections 3 on the wafer table 2 in a row along an X-axis with their gates facing the processing station 20. Wafer carrying tweezers 4 carry a wafer W from and to a selected wafer cassette 1. The wafer carrying tweezers 4 are able to move in directions parallel to the X-axis along which the wafer cassettes 1 are arranged and in vertical directions parallel to a Z-axis along which wafers W are stacked in each wafer cassette 1, and are able to turn in directionsθ. The wafer carrying tweezers 4 are able to carry a wafer W to an alignment unit ALIM and an extension unit EXT belonging to a multistage unit included in a third group G3 of the processing station 20.

Referring to FIG. 1, the processing station 20 is provided with a main wafer carrying mechanism (main substrate carrying mechanism) 21 of a vertical carrying type in a chamber 22 formed in its central region. One or a plurality of groups of all the processing units are arranged in layers around the chamber 22 containing the main wafer carrying mechanism 21. This patterned resist film forming system has five multistage groups G1, G2, G3, G4 and G5. Processing units of the first multistage group G1 and the second multistage group G2 are disposed on the front side (the lower side in FIG. 1), processing units of the third multistage group G3 are disposed beside the cassette station 10, processing units of the fourth multistage group G4 are disposed beside the interface unit 30, and processing units of the fifth multistage group G5 are disposed on the back side.

As shown in FIG. 2, the first multistage group G1 has a developing unit DEV including a cup (vessel) 23, and a developer pouring device, not shown, for developing a resist pattern on a wafer W in the cup 23, and a resist application unit COT disposed under the developing unit DEV and including the substrate processing apparatus of the present invention that subjects a wafer W held by a spin chuck, not shown, to a predetermined process. Similarly, the second multistage group G2 has a developing unit DEV and a resist application unit COT disposed under the developing unit DEV. The resist application units COT are disposed on the lower stage because draining a resist solution requires troublesome work and a complicated mechanism, and maintenance of the resist application units COT is difficult. When necessary, the resist application units COT may be disposed on the upper stage.

Referring to FIG. 3, the third multistage group G3 has eight vertically stacked oven-type processing units for processing a wafer W mounted on a wafer support table 24, such as a cooling unit COL for cooling a wafer W, an adhesion unit AD for processing a wafer W for a hydrophobic property endowment process, an alignment unit ALIM for positioning a wafer W, an extension unit EXT for carrying a wafer W, and four hot plate units HP for baking a wafer W, which are stacked upward in that order. Similarly, the fourth multistage group G4 has eight vertically stacked oven-type processing units, such as a cooling unit COL, an extension cooling unit EXTCOL, an extension unit EXT, a cooling unit COL, two chilling hot plate units CHP capable of quenching, and two hot plate units HP, which are stacked upward in that order.

The cooling units COL and the extension cooling unit EXSTCOL that use low process temperatures are disposed on the lower stages, and the hot plate units HP, the chilling hot plate units CHP and the adhesion units AD that use higher process temperatures are disposed on the upper stages to reduce thermal interference between the units. Needless to say, those units may be stacked in any arrangement.

As shown in FIG. 1, in the processing station 20, vertical ducts 25 and 26 are extended in the side walls of the processing units (oven-type processing units) of the third multistage group G3 and the fourth multistage group G4 disposed respectively near the processing units (spinner-type processing units) of the first multistage group G1 and the second multistage group G2. Clean air or air of a specific temperature flows down in those ducts 25 and 26. The ducts shield the spinner-type processing units of the first multistage group G1 and the second multistage group G2 from heat generated by the oven-type processing units of the third multistage group G3 and the fourth multistage group G4.

In the patterned resist film forming system, a fifth multistage group G5 including processing units can be disposed behind the main wafer carrying mechanism 21 as indicated by dotted lines in FIG. 1. The processing units of the fifth multistage group G5 can be laterally moved along guide rails 27. Since the processing units of the fifth multistage group G5 can be laterally shifted to form a vacant space behind the main wafer carrying mechanism 21 to facilitate performing maintenance work on the main wafer carrying mechanism 21 from behind the same.

The interface unit 30 has a depth equal to that of the processing station 20 and a narrow width. In the interface unit 30, a portable pick-up cassette 31 and a stationary buffer cassette 32 are stacked in a front region, an edge exposure device 33 is disposed in a back region, and a wafer-carrying arm 34 is disposed in a central region. The wafer-carrying arm 34 moves in directions parallel to the X-axis and the Z-axis to carry a wafer W to the cassettes 31 and 32 and the edge exposure device 33. The wafer-carrying arm 34 is able to turn in the θ directions to carry a wafer W to the extension units EXT of the fourth multistage group 4 on the side of the processing station 20 and to a wafer transfer table, not shown, on the side of the edge exposure device 33.

The patterned resist film forming system of this construction is installed in an efficient vertical laminar flow clean room 4 of a high cleanliness.

The operation of the patterned resist film forming system will be described. The wafer carrying tweezers 4 of the cassette station 10 access the cassette 1 containing unprocessed wafers W and placed on the cassette table 2, and take out one wafer W fro the cassette 1. The wafer carrying tweezers 4 carries the wafer W to the alignment unit ALIM of the third multistage group G3 of the processing station 20, and place the wafer W on the wafer support table 24 in the alignment unit ALIM. The wafer W placed on the wafer table 24 is subjected to orientation using an orientation flat and centering. Then, the main wafer carrying mechanism 21 accesses the alignment unit ALIM to receive the wafer W from the wafer table 24.

At the processing station 20, the main wafer carrying mechanism 21 carries the wafer W to the adhesion unit AD of the third multistage group G3. The adhesion unit AD processes the wafer W by a hydrophobic property endowment process. Then, the main wafer carrying mechanism 21 carries the wafer W from the adhesion unit AD to the cooling unit COL of the third multistage group G3 or the fourth multistage group G4. The cooling unit COL cools the wafer W to a set temperature of, for example, 23° C. Then, the main wafer carrying mechanism 21 carries the wafer W from the cooling unit COL to the resist application unit COT of the first multistage group G1 or the second multistage group G2. The resist application unit COT forms a resist film of a uniform thickness on a surface of the wafer W by a spin-coating method.

Then the main wafer carrying mechanism 21 carries the wafer W coated with the resist film from the resist application unit COT to the hot plate unit HP. The wafer W placed on a wafer table in the hot plate unit HP is subjected to a prebaking process at a predetermined temperature of, for example, 100° C. for a predetermined time to remove a solvent remaining in the resist film by evaporation. Then, the main wafer carrying mechanism 21 carries the wafer from the hot plate unit HP to the extension cooling unit EXTCOL of the fourth multistage group G4. The extension cooling unit EXTCOL cools the wafer W to a suitable temperature for an edge exposure process to which the wafer W is subjected by the edge exposure device 33. The suitable temperature is, for example, 24° C. Then, the main wafer carrying mechanism 21 carries the cooled wafer W from the extension cooling unit EXTCOL to a wafer table, not shown, in the extension unit EXT disposed on top of the extension cooling unit EXTCOL. Then, the wafer-carrying arm 34 of the interface unit 30 accesses the wafer W placed on the wafer table from the opposite side and carries the wafer W to the edge exposure device 33 of the interface unit 30. The edge exposure device 33 exposes edge parts of the wafer W.

After the completion of the edge exposure process, the wafer-carrying arm 34 carries the wafer W from the edge exposure device 33 to a wafer transfer table, not shown, on the side of the adjacent exposure device. In some cases, the wafer W is stored temporarily in the buffer cassette 32 before the wafer W is transferred to the exposure device.

After the resist film has been entirely exposed by the exposure device and has been returned to the wafer transfer table near the exposure device, the wafer-carrying arm 34 of the interface unit 30 carries the wafer W from the wafer transfer table to the extension unit EXT of the fourth multistage group G4 of the processing station 20 and places the wafer W on a wafer receiving table. In some cases, the wafer W is stored temporarily in the buffer cassette 32 of the interface unit 30 before the wafer W is transferred to the processing station 20.

The main wafer carrying mechanism 21 carries the wafer W from the wafer receiving table to the chilling hot plate unit CHP. The chilling hot plate unit CHP subjects the wafer W to a post-exposure baking process to prevent fringe formation or to induce an acid-catalytic reaction in a chemically amplified resist.

Subsequently, the wafer W is carried to the developing unit DEV of the first multistage group G1 or the second multistage group G2. The developing unit DEV wets uniformly the resist film formed on the surface of the wafer W with a developer for a developing process. After the completion of development, a rising solution is poured on the surface of the wafer W to rinse off the remaining developer from the wafer W.

After the completion of the developing process, the main wafer carrying mechanism 21 carries the wafer W from the developing unit DEV to the hot plate unit HP of third multistage unit G3 or the fourth multistage unit G4. The hot plate unit HP heats the wafer W at, for example, 100° C. for a predetermined time to process the wafer W by a post-baking process to enhance the chemical resistance of the resist film by hardening the resist film swollen by the developing process.

Then, the main wafer carrying mechanism 21 carries the wafer W from the hot plate unit HP to one of the cooling unit COL to cool the wafer W to an ordinary temperature. Then the main wafer carrying mechanism 21 carries the wafer W from the cooling unit COL to the extension unit EXT of the third multistage group G3 and places the wafer W on a table in the extension unit EXT. Then, the wafer carrying tweezers 4 of the cassette station 10 accesses the wafer W from the opposite side, receive the wafer W and carry the wafer W, and insert the wafer W in predetermined wafer guide grooves in a cassette 1 for containing processed wafers. Thus all the processes are completed.

The substrate processing apparatus COT of the present invention will be described with reference to FIGS. 4 to 10, in which parts like or corresponding to those of the conventional substrate processing apparatus are denoted by the same reference characters and the description thereof will be omitted.

Figure 4:
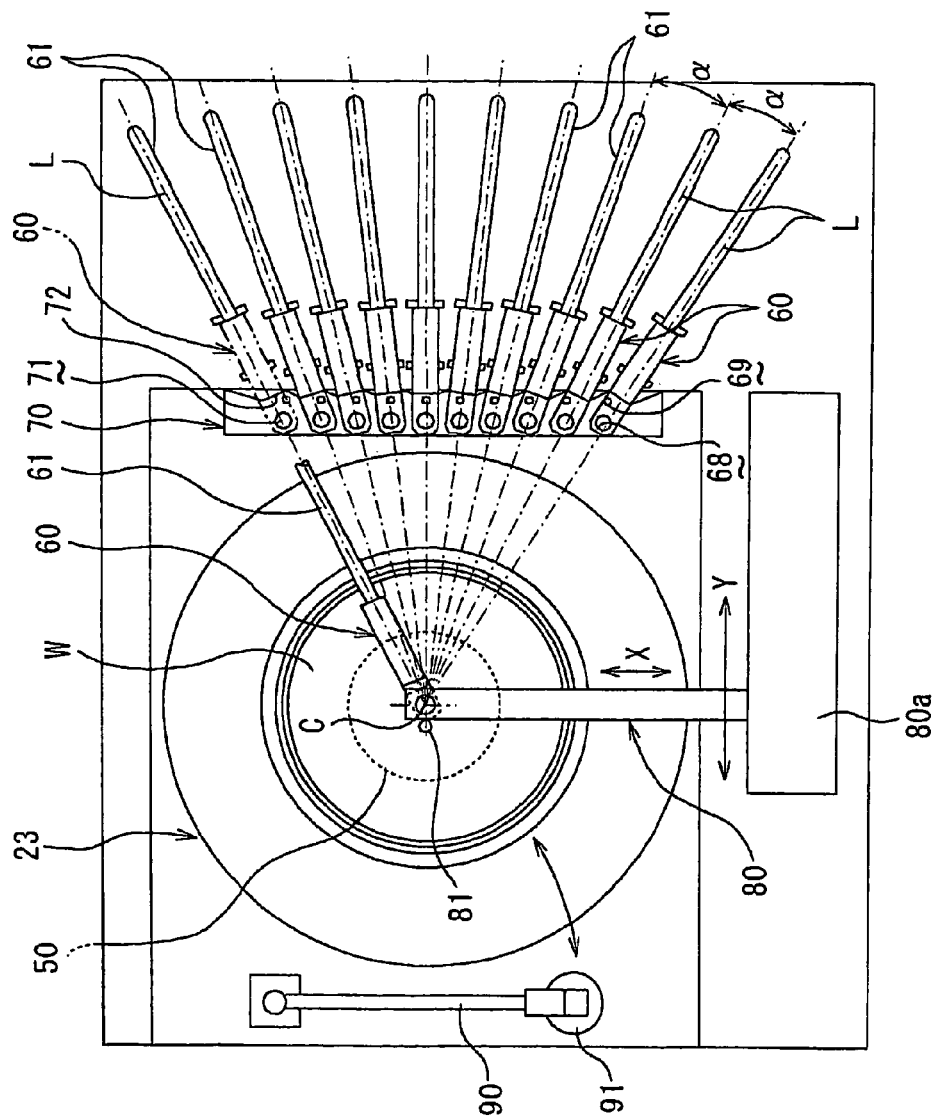
FIG. 4 is a plan view of an essential part of the substrate processing apparatus embodying the present invention.
Figure 5:
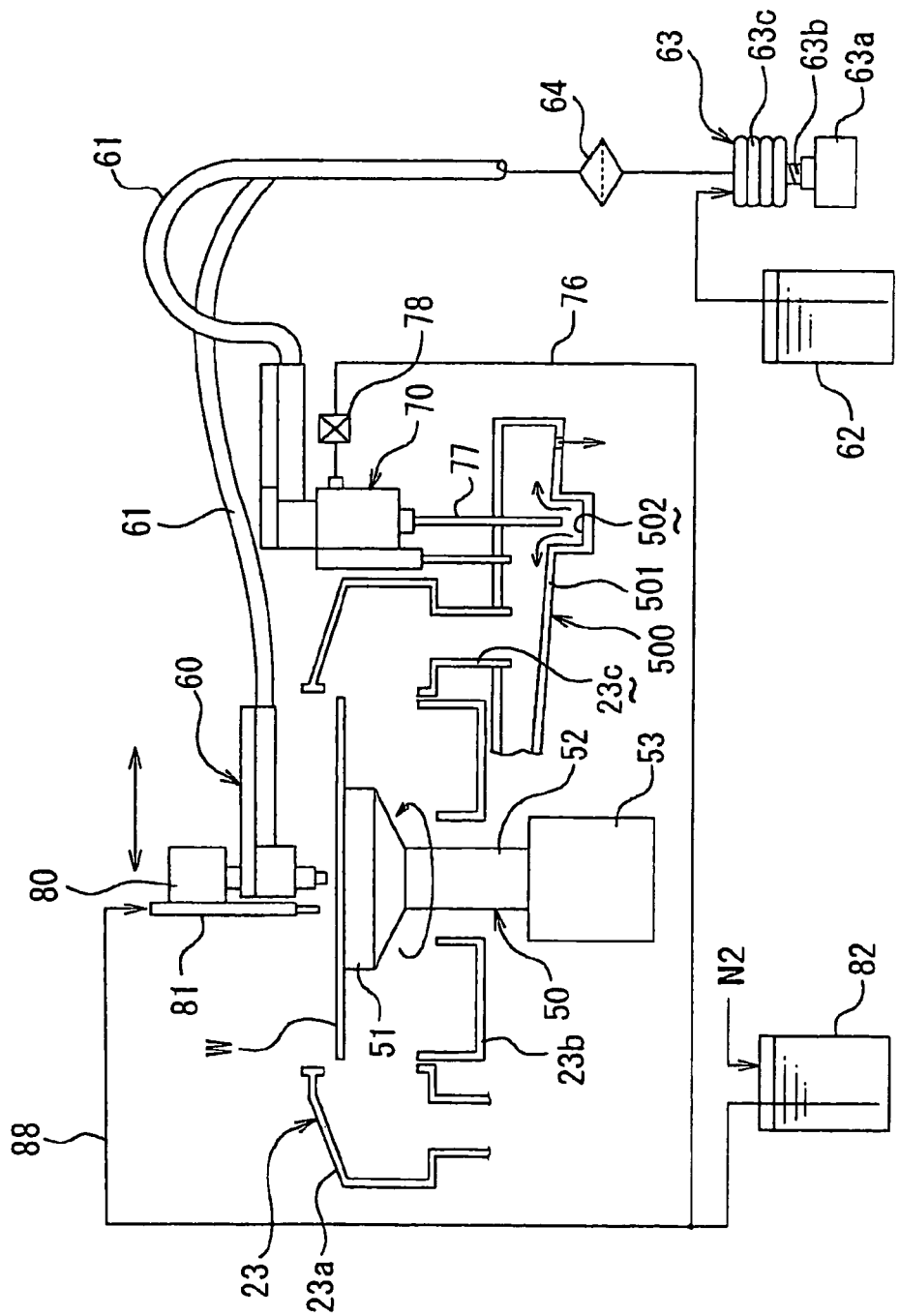
FIG. 5 is a schematic sectional view of the substrate processing apparatus shown in FIG. 4.

Referring to FIGS. 4 and 5, the substrate processing apparatus (COT) of the present invention includes, as principal components, a spin chuck 50, i.e., a rotary workpiece-holding means for holding and rotating a wafer W, a plurality of processing liquid pouring nozzles 60, namely, ten processing liquid pouring nozzles 60, for pouring resist solutions (processing liquids) on a surface of the wafer W held by the spin chuck 50, a solvent bath 70 (nozzle-holding means) for holding the processing liquid pouring nozzles 60 at their home positions beside the spin chuck 50, and a nozzle-carrying arm 80 for detachably gripping a desired one of the processing liquid pouring nozzles 60 held by the nozzle holding apparatus 70, and carrying the desired processing liquid pouring nozzle 60 to a working position above the wafer W.

The nozzle-carrying arm 80 can be moved by a moving mechanism 80a in directions parallel to the X-axis and the Y-axis in a horizontal plane, and in vertical directions parallel to the Z-axis. Since the nozzle-carrying arm 80 is movable in the horizontal directions parallel to the X-axis and the Y-axis and in the vertical directions parallel to the Z-axis, the nozzle-carrying arm 80 can be accurately positioned to grip the processing liquid pouring nozzle 60. The solvent bath 70 differing from the conventional one is fixed. A solvent spouting nozzle 81 capable of spouting a solvent is fixed to the nozzle-carrying arm 80. A space extending around and under the spin chuck 50 and the wafer W held on the spin chuck 50 are surrounded by a cup 23 (vessel) consisting of an outer cup 23a and an inner cup 23b. Mist of the resist solution splashed about by the wafer W during a resist film forming process is caught by the cup 23. A nozzle rest 91 is disposed opposite to the solvent bath 70. A rinsing liquid pouring nozzle 90 rests on the nozzle rest 91.

The processing liquid pouring nozzles 60 are held in alignment with straight lines L extending between the center C of the spin chuck 50 about which the spin chuck 50 rotates and nozzle holding openings 71 formed at suitable intervals in the solvent bath 70, respectively; that is, the processing liquid pouring nozzles 60 are extended in a substantially radial arrangement at predetermined angular intervals α° from the center C of the spin chuck 50 and are held by the solvent bath 70. Flexible supply tubes 61 connecting the processing liquid pouring nozzles 60 to resist solution tanks 62 are arranged on extensions of the straight lines L, respectively. Thus the processing liquid pouring nozzles 60 are held by the solvent bath 70 in a substantially fan-shaped arrangement on a plane.

Figure 7:
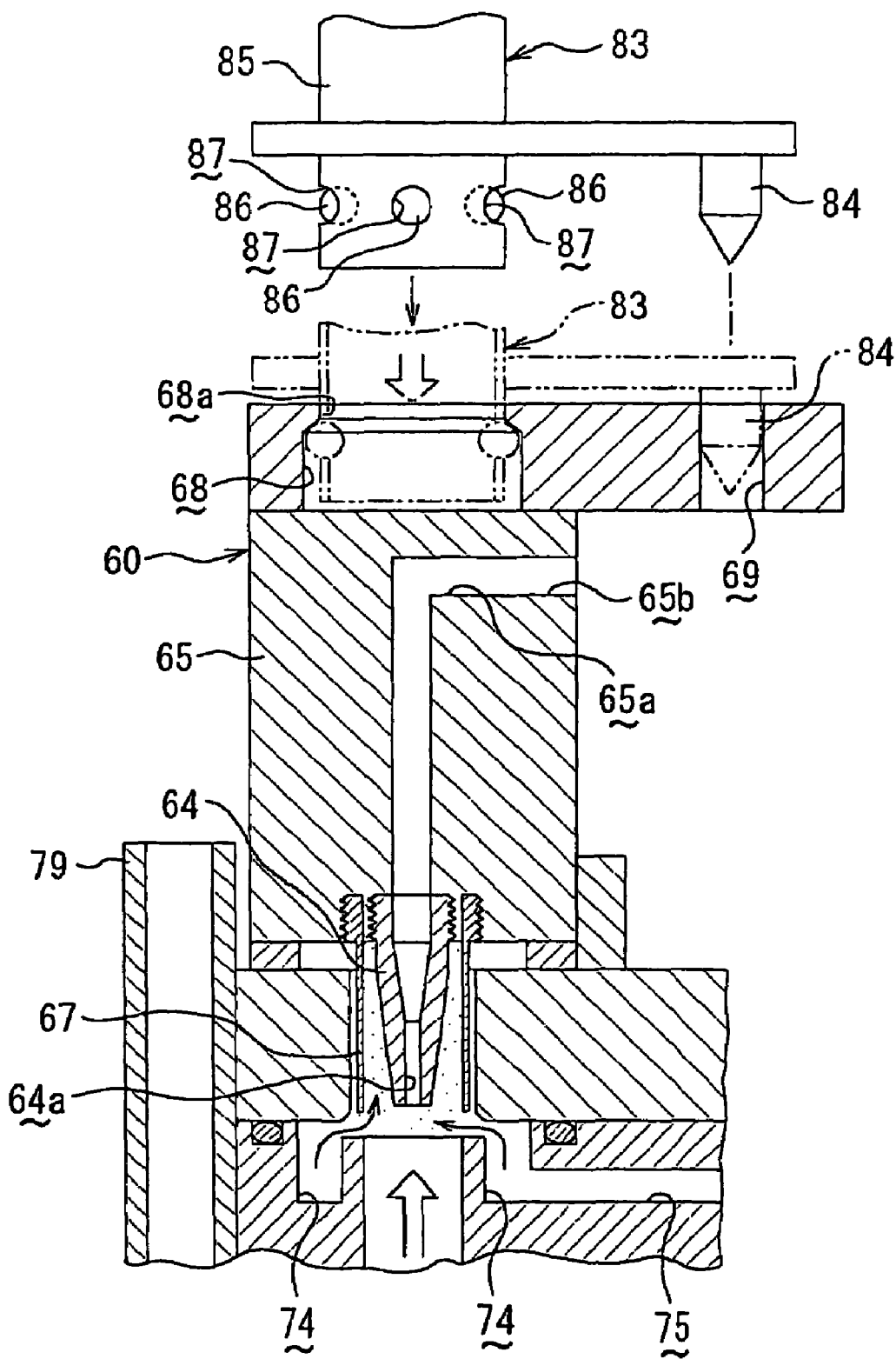
FIG. 7 is an enlarge sectional view of a part of FIG. 6.
Figure 8:
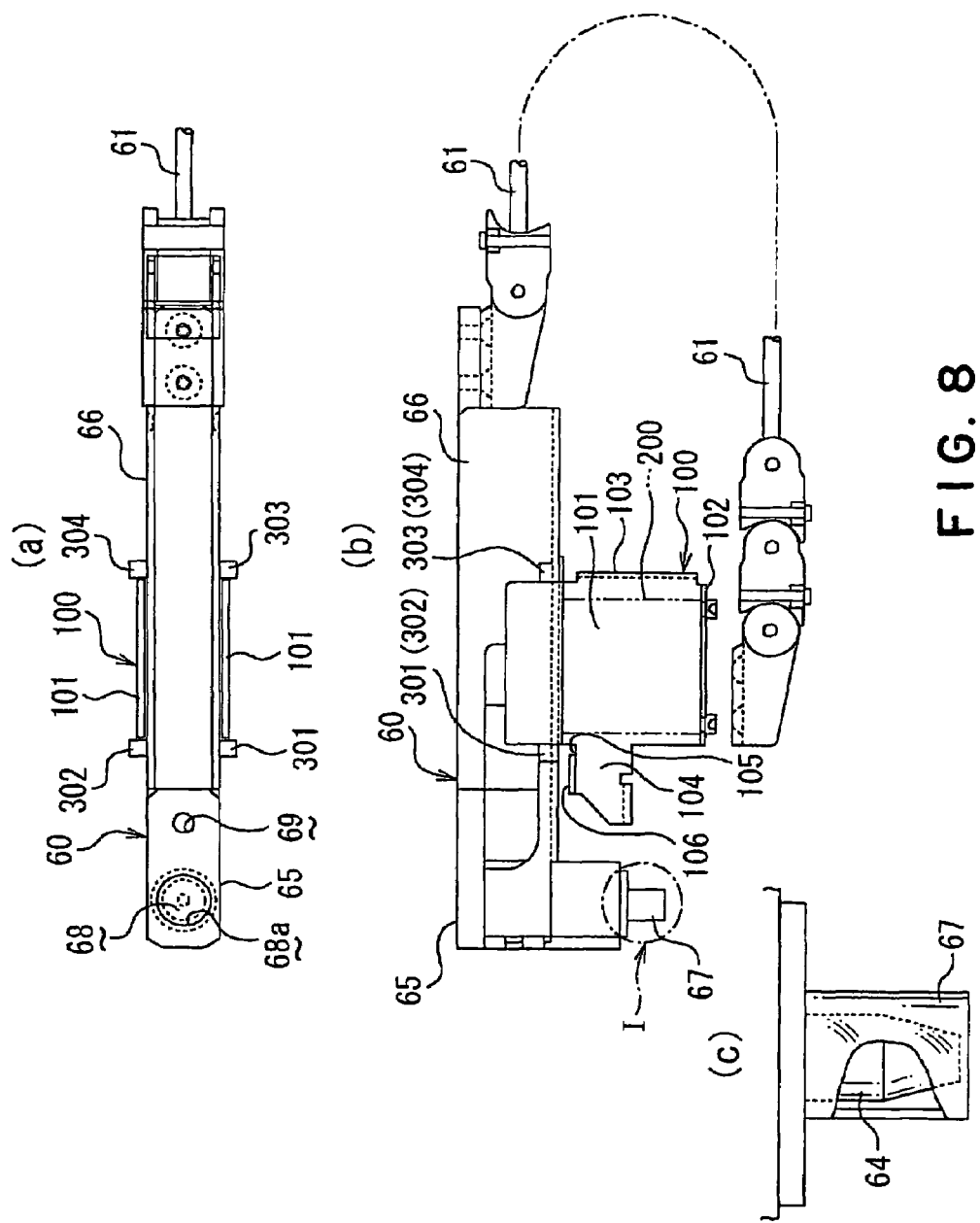
FIGS. 8(a), 8(b) and 8(c) are a plan view, a side elevation and an enlarged sectional view, respectively, of a processing liquid pouring nozzle included in the substrate processing apparatus embodying the present invention.
Figure 9:
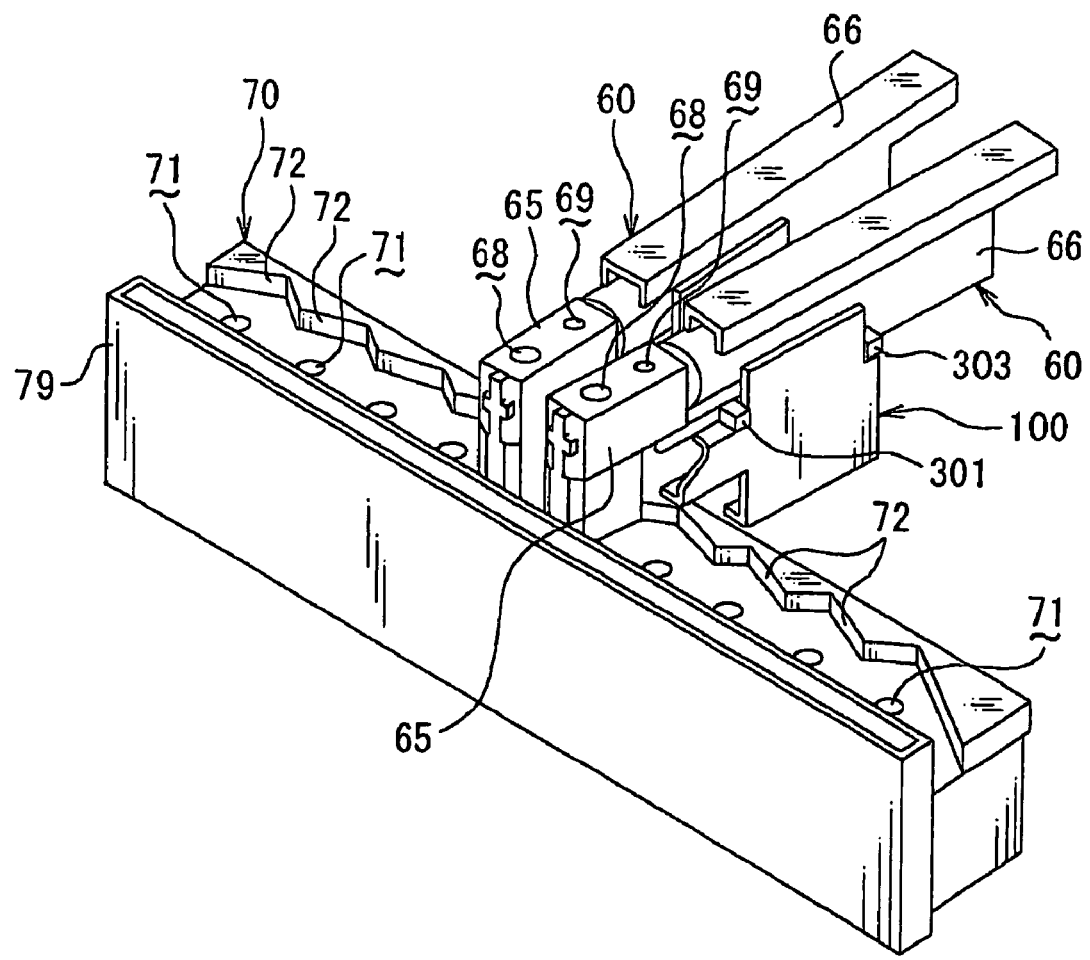
FIG. 9 is a perspective view of the processing liquid pouring nozzles according to the present invention held at their home positions.

Referring to FIGS. 7 to 9, each processing liquid pouring nozzle 60 has, as principal components, a needle-shaped nozzle tip 64 having a pouring orifice 64a (discharge orifice or dropping orifice) opening downward, a nozzle head 65 having the shape of a block and holding the nozzle tip 64, and a tube protector 66 attached to a side surface of the nozzle head 65 to protect the supply tube 61. The supply tube 61 is extended through the tube protector 66. The supply tube 61 has one end connected to a port 65b continuous with a liquid passage 65a formed in the nozzle head 65, and the other end connected to the resist solution tank 62. A pump 63 and a filter 64 are placed in that order from the side of the resist solution tank 62 on the supply tube 61. The pump 63 is, for example, a diaphragm pump including a diaphragm 63c, a ball screw 63b for moving the diaphragm 63c, and a reversible motor 63a for driving the ball screw 63b.

A cylindrical cover 67 (FIG. 8) formed of a transparent synthetic resin is attached to the nozzle head 65 so as to surround the nozzle tip 64. The cylindrical cover 67 extends down to a plane slightly below a plane including the tip of the pouring orifice 64a (discharge orifice or dropping orifice) of the nozzle tip 64 to protect the tip of the nozzle tip 64 and to facilitate the confirmation of suck back through the processing liquid pouring nozzle 60.

The nozzle head 65 of the processing liquid pouring nozzle 60 is provided in its upper surface with a gripper receiving hole 68 in which a gripper 83 held on the nozzle-carrying arm 80 engages detachably, and a positioning hole 69 in which a positioning pin 84 held near the gripper 83 on the nozzle-carrying arm 80 engages. The gripper receiving hole 68 has a reduced open upper end 68a. The diameter of the positioning hole 69 is slightly greater than that of the positioning pin 84.

The gripper 83 has a cylindrical member 85 capable of being inserted through the reduced open upper end 68a in the gripper receiving hole 68, and spherical balls 86 held respectively in radial through holes 87 formed at equal angular intervals in a lower part of the cylindrical member 85 so as to be radially movable in the radial through holes 87 and of partly protruding from the circumference of the lower part of the cylindrical member 85. Compressed air supplied from a compressed air source, not shown, is supplied into the cylindrical member 85 to force the balls 86 to project partly from the radial through holes 87. The balls 86 thus partly projecting from the radial through holes 87 engage with the inner end surface of a wall defining the reduced open upper open end 68a to grip the processing liquid pouring nozzle 60. When the gripper 83 held on the nozzle-carrying arm 80 grips the processing liquid pouring nozzle 60, the positioning pin 84 held on the nozzle-carrying arm 80 engages in the positioning hole 69 of the processing liquid pouring nozzle 60. Consequently, the nozzle-carrying arm 80 is able to carry the processing liquid pouring nozzle 60 between the home position of the processing liquid pouring nozzle 60 on the solvent bath 70 and a working position corresponding to the center C of the spin chuck 50 without changing the angular position of the processing liquid pouring nozzle 60, that is, without changing the angular position of the processing liquid pouring nozzle 60 held on the solvent bath 70 and extending toward the center C of the spin chuck 50.

The gripper receiving holes 68 and the positioning holes 69 of all the processing liquid pouring nozzles 60 must coincide with the gripper 83 and the positioning pin 84 of the nozzle-carrying arm 80 to enable the single nozzle-carrying arm 80 to carry any one of the processing liquid pouring nozzles 60. The gripper receiving holes 68 of all the processing liquid pouring nozzles 60 have the same shape, and the positioning holes 69 of all the processing liquid pouring nozzles 60 have the same shape. However, the respective positions of the positioning holes 69 of the processing liquid pouring nozzles 60 are different because the processing liquid pouring nozzles 60 are held in different angular positions at the home positions, respectively, with respect to the nozzle-carrying arm 80. That is, since the gripper 83 and the positioning pin 84 are held on the nozzle-carrying arm 80 on a line parallel to the Y-axis, the gripper receiving hole 68 and the positioning hole 69 of each of the processing liquid pouring nozzles 60 are on a line parallel to the Y-axis as shown in FIG. 4.

The solvent bath 70 has an upper wall provided with nozzle receiving holes 71, and angular position determining protrusions 72 formed in a zigzag arrangement on the upper wall. The processing liquid pouring nozzles 60 are held on the solvent bath 70 with the side surfaces of their nozzle heads 65 in contact with the angular position determining protrusions 72. The angular position determining protrusions 72 may be formed either integrally with the upper wall of the solvent bath 70 or separately from the upper wall of the solvent bath 70. If the angular position determining protrusions 72 are individual members, the same angular position determining protrusions 72 can be used for positioning the processing liquid pouring nozzles 60 symmetrical with respect to the processing liquid pouring nozzle 60 extending parallel to the Y-axis at their home positions and hence the number of component parts can be reduced.

Figure 6:
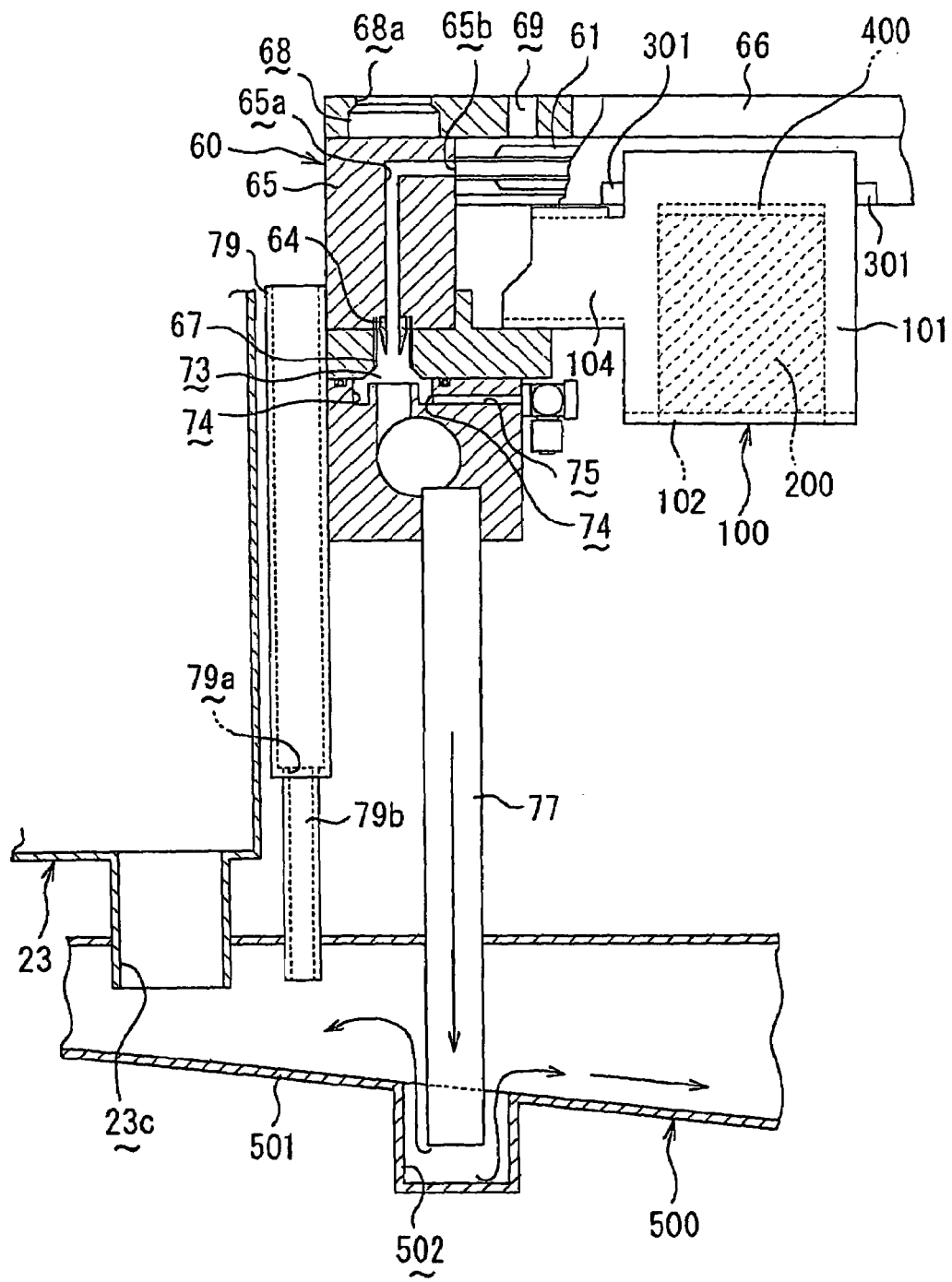
FIG. 6 is a sectional view of an essential part of the substrate processing apparatus shown in FIG. 4.
Figure 10:
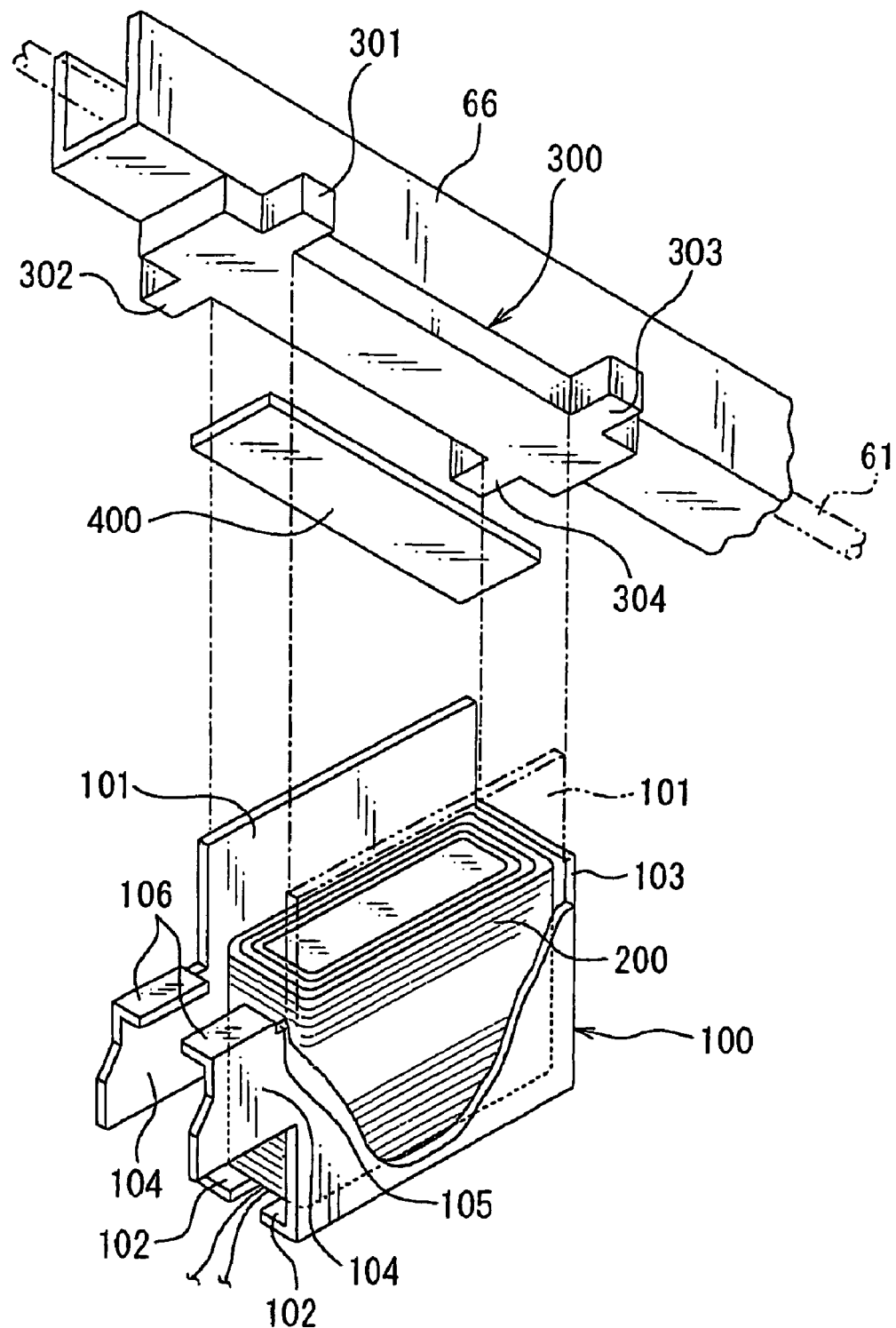
FIG. 10 is an exploded perspective view of a nozzle holding device according to the present invention for holding the processing liquid pouring nozzles.
Figure 11:
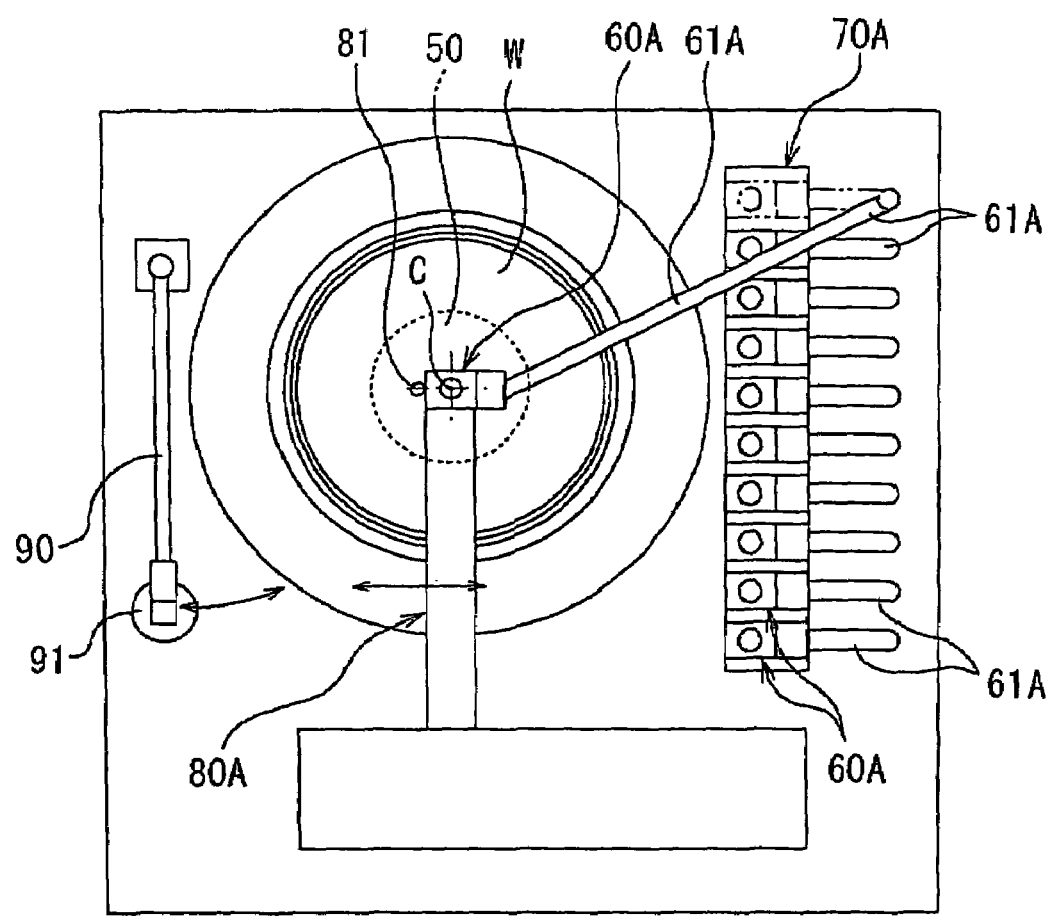
FIG. 11 is a plan view of a conventional substrate processing apparatus.

Horizontal movement inhibiting members 100 are disposed on the side opposite the side of the spin chuck 50 with respect to the solvent bath 70. The horizontal movement inhibiting members 100 are contiguous with the opposite side surfaces of each processing liquid pouring nozzle 60. As best shown in FIGS. 6, 8 and 10, the horizontal movement inhibiting member 100 has two opposite side parts 101 that come into contact with the opposite side surfaces of the tube protector 66 attached to the processing liquid pouring nozzle 60, holding parts 102 extending substantially perpendicularly to the side parts 101 from the lower ends of the side parts 101 toward each other, a connecting part 103 extending between lower parts of the back edges of the side parts 101, support parts 104 extending forward from middle parts of the front edge of the side parts 101, and horizontal parts 106 extending substantially perpendicularly to the support parts 104 from the upper edges of the support parts 104 toward each other such that gaps 105 are formed between the back ends thereof and the front edges of the side parts 101. Each of the horizontal movement inhibiting members is provided with an electromagnet 200 having an attraction top surface, i.e., an attractive fixating means for fixedly holding the processing liquid pouring nozzle in place. The electromagnet is placed in a space between the side parts 101 and is fixedly mounted on the holding parts 102.

A holding member 300 is attached to the lower surface of the tube protector 66 attached to each processing liquid pouring nozzle 60. The holding member 300 has four vertical movement inhibiting projections 301, 302, 303 and 304 that engage with the opposite ends of the side parts 101 of the horizontal movement inhibiting member 100. A magnetic plate 400, namely, a contact plate, is attached to the lower surface of the tube protector 66 attached to each processing liquid pouring nozzle 60. The magnetic plate 400 is attracted to the attraction top surface of the electromagnet 200.

The horizontal movement inhibiting member 100 comes into contact with the side surfaces of the processing liquid pouring nozzle 60 to control the horizontal movement of the processing liquid pouring nozzle 60 on the solvent bath 70. The vertical movement inhibiting projections 301 to 304 of the holding member 300 engages with the opposite ends of the side parts 101 of the horizontal movement inhibiting member 100. More concretely, the two front vertical movement inhibiting projections 301 and 302 engage with the front ends of the side parts 101 and the horizontal parts 106, and the two back vertical movement inhibiting projections 303 and 304 engage with the back ends of the side parts 101. Consequently, processing liquid pouring nozzle is restrained from turning about an axis passing the projections 301 and 302 such that a back part of the processing liquid pouring nozzle 60 rises vertically.

The electromagnet 200 held in the horizontal movement inhibiting member 100 attracts the magnetic plate 400 attached to the processing liquid pouring nozzle 60 so as to correspond to the electromagnet 200 when the tube protector 66 attached to the processing liquid pouring nozzle 60 is held between the side parts 101 of the horizontal movement inhibiting member 100. Thus the processing liquid pouring nozzle 60 can be firmly held in place on the solvent bath 70.

Although the electromagnet 200 is employed as the attractive fixating means in this embodiment, a vacuum pad that attracts an object by suction may be used instead of the electromagnet 200, provided that the contact plate has a flat surface facing the attractive fixating means.

Referring to FIGS. 5 to 7, the solvent bath 70 has a solvent vapor atmosphere forming space 73 continuous with the nozzle holding openings 71 and bottomed by a solvent storage troughs 74 for containing a solvent (thinner) capable of dissolving the solutes (resists) of the processing liquids (resist solutions). The solvent storage troughs 74 lie on the opposite sides of the nozzle tips 64, respectively, as shown in FIGS. 6 and 7. A solvent supply tube 76 is connected to a solvent supply passage 75 connected to the solvent storage troughs 74. As shown in FIG. 5, the solvent supply tube 76 is connected through an on-off valve 78 to a main solvent supply tube 88 connected to a solvent tank 82. For example, the on-off valve 78 is opened periodically so that the solvent is contained always in the solvent storage troughs 74. The solvent (the thinner) stored in the solvent storage troughs 74 evaporates to maintain a solvent vapor atmosphere (thinner vapor atmosphere) in the solvent vapor atmosphere forming space 73.

A drain pipe 77 communicating with the nozzle holding openings 71 extends downward. The drain pipe 77 is inserted in a drain/exhaust duct 500 such that its lower end lies in a sump 502 formed in the bottom wall 501 of the drain/exhaust duct 500. A waste liquid drained through the drain pipe 77 collects in the sump 502, overflows the sump 502 and the waste liquid over flowed the sump 502 is discharged. An outlet 23c formed in the bottom wall of the cup 23 is connected to the drain/exhaust duct 500. The bottom wall 501 of the drain/exhaust duct 500 is sloped.

The processing liquid pouring nozzles 60 held on the solvent bath 70 can be kept in the solvent vapor atmosphere. Thus the processing liquids (resist solutions) remaining in the pouring orifices 64a of the processing liquid pouring nozzle 60 can be prevented from drying up. The waste liquids (waste resist solutions) can be carried by the drain pipe 77 to the drain/exhaust duct 500. The reverse flow of the waste liquids and waste gases flowing through the drain/exhaust duct 500 into the processing liquid pouring nozzles 60 can be prevented by a sealing structure combined with the sump 502. Since the drain/exhaust duct 500 is connected to the outlet 23c formed in the bottom wall of the cup 23 and the bottom wall of the drain/exhaust duct 500 is sloped, the processing liquids (resist solutions) dripped from the processing liquid pouring nozzles 60 held on the solvent bath 70 and used processing liquids (resist solutions and solvents) and waste gases can be discharged through the drain/exhaust duct 500.

A nozzle receiving box 79 is joined to a side wall, on the side of the cup 23, of the solvent bath 70. The nozzle receiving box 79 receives the nozzle head of the processing liquid pouring nozzle 60 when the nozzle-carrying arm 80 grips the processing liquid pouring nozzle 60. A drainpipe 79b connected to a drain port 79a formed in the bottom wall of the nozzle receiving box 79 is connected to the drain/exhaust duct as shown in FIG. 6.

The spin chuck 50 has a vacuum chuck 51 for holding a wafer w, and a shaft 52 connected to a motor 53. The motor 53 is controlled by control signals provided by a controller, not shown, such as a central processing unit (CPU), for operations at a predetermined low rotating speed and a predetermined high rotating speed.

A solvent pouring nozzle 81 is connected to the solvent tank 82 by the main solvent supply tube 88. A compressed gas, such as compressed $N_2$ gas, is supplied into the solvent tank 82 to pour (to spout or to drop) the solvent stored in the solvent tank 82 through the solvent pouring nozzle 81.

A resist film forming procedure for forming a resist film on a wafer W to be carried out by the thus constructed substrate processing apparatus will be described by way of example. The main wafer carrying mechanism 21 carries a wafer W and places the wafer W on the spin chuck 50, and the spin chuck 50 holds the wafer W. Then, the nozzle-carrying arm 80 grips the predetermined processing liquid pouring nozzle 60, moves the solvent pouring nozzle 81 fixed thereto to a position above the center of the stationary wafer W. Then, the solvent, such as a thinner, is poured on the stationary wafer W. Then, the nozzle-carrying arm 80 carries the processing liquid pouring nozzle 60 to a position above the center of the wafer @. Since the moving mechanism 80a moves the nozzle-carrying arm 80 simultaneously in directions parallel to the X-axis and the Y-axis toward the position above the center of the wafer W, the processing liquid pouring nozzle 60 can be moved along the straight line L and hence the supply tube 61 connected to the processing liquid pouring nozzle 60 does not interfere with the supply tubes 61 connected to the adjacent processing liquid pouring nozzles 60.

After the processing liquid pouring nozzle 60 has been positioned at the position above the center of the wafer W, the nozzle-carrying arm 80 moves vertically along the Z-axis, the spin chuck 50 is driven for rotation to spread the solvent and to form a solvent film on the wafer W by rotating the wafer W for a short time. After the solvent film has been formed on the wafer W, the spin chuck 50 is rotated at a high rotating speed and the resist solution (the processing liquid) is poured onto the center of the wafer W. The pouring operation for pouring the resist solution onto the wafer W is stopped and, at the same time, the rotating speed of the wafer W is reduced temporarily to smooth form a uniform film of the resist solution. Then, the film of the resist solution is dried to complete a resist film. At the same time, the processing liquid pouring nozzle 60 is retracted from the position above the wafer W to the home position on the solvent bath 70, where the nozzle tip 64 is received in the nozzle holding opening 71. Then, the resist solution is discharged through the processing liquid pouring nozzle 60 held at the home position on the solvent bath 70 for dummy dispensing, and the processing liquid pouring nozzle 60 is held at the home position until the same is used again. Since the solvent vapor atmosphere is created in the solvent vapor atmosphere space 73, the resist solution remaining in the nozzle tip 64 will not dry up.

After the resist film has been formed on the wafer W, the rinsing liquid pouring nozzle 90 is moved to a position above a peripheral part of the wafer W and a rinsing liquid is poured onto the wafer W for a rinsing process. The rinsing liquid is supplied to the back surface of the wafer W for a back rinsing process. Then, the wafer W is rotated at a high rotating speed to shake off the rinsing liquid. Then, the spin chuck 50 is stopped to end the resist film forming procedure.

After the resist film forming procedure has been completed, the main wafer carrying mechanism 21 receives the wafer W from the spin chuck 50, carries the wafer W from the resist application unit COT to the hot plate unit HP.

Although the substrate processing apparatus of the present invention has been described as applied to processing a semiconductor wafer W, the substrate processing apparatus is applicable also to processing substrates, such as LCD substrates and photomask substrates, other than semiconductor wafers.

As apparent from the foregoing description, the substrate processing procedure and the substrate processing apparatus according to the present invention have the following effects.

1) According to the present invention, the nozzle carrying means grips the processing liquid pouring nozzle and carries the processing liquid pouring nozzle along the straight lines extending between the center of the rotary holding means and the nozzle holding opening of the nozzle-holding means. Therefore, the supply tubes does not interfere with the adjacent supply tubes, the processing liquid pouring nozzle can be smoothly moved between the home position and the working position and the dislocation of the processing liquid pouring nozzle can be prevented. Consequently, the positional accuracy of the processing liquid pouring nozzle can be improved, and thereby processing accuracy and yield can be improved.

2) According to the present invention, the processing liquid pouring nozzles are held on the nozzle-holding means with the side surfaces of their nozzle heads in contact with the angular position determining walls. Therefore, the processing liquid pouring nozzles held at their home positions will not be accidentally dislocated, which further enhances the effect stated in 1) on preventing the dislocation of the processing liquid pouring nozzles on the nozzle-holding means.

3) According to the present invention, the processing liquid pouring nozzles held on the nozzle-holding means are restrained from horizontal and vertical movement, which further enhances the effects stated in 1) and 2) on preventing the dislocation of the processing liquid pouring nozzles on the nozzle-holding means. Since the horizontal movement inhibiting members are provided with attractive fixating means for fixedly holding the processing liquid pouring nozzles in place, and the processing liquid pouring nozzles are provided with plates at positions respectively corresponding to the attractive fixating means, the processing liquid pouring nozzles can be firmly fixed on the nozzle-holding means. Thus, the dislocation of the processing liquid pouring nozzles can be further surely prevented.

4) According to the present invention, the nozzle carrying means grips the processing liquid pouring nozzle by engaging the gripper in the gripper receiving hole and engaging the positioning pin in the positioning hole. Therefore, the angular position of the processing liquid pouring nozzle is not changed and the processing liquid pouring nozzle can maintain the fixed angular position at all times. Thus the accuracy of positioning the processing liquid pouring nozzle at the working position and at the home position can be improved in addition to the effects stated in 1) to 3), and the processing liquid pouring nozzle can be smoothly carried.

5) According to the present invention, the nozzle heads of the processing liquid pouring nozzles held on the nozzle-holding means can be kept in the solvent vapor atmosphere. Therefore, the processing liquid remaining in the nozzle tips of the processing liquid pouring nozzles held at the home positions can be prevented from drying up. Since the used processing liquids can be drained through the drain pipe into the drain/exhaust duct, and the reverse flow of the drained processing liquids and waste gases can be inhibited by the sealing mechanism combined with the sump, the processing liquid pouring nozzles held at the home positions will not be contaminated with the waste gases. Since the outlet formed in the bottom wall of the cup is connected to the drain/exhaust duct and the bottom wall of the drain/exhaust duct is sloped, the processing liquids discharged from the processing liquid pouring nozzles held at the home positions, and the drained, used processing liquids and the waste gases can be discharged through the drain/exhaust duct.

The invention claimed is:

1. A substrate processing apparatus comprising:
   a rotary workpiece-holding means for holding and rotating a substrate;
   a plurality of processing liquid pouring nozzles for pouring processing liquids on a surface of the substrate held by the rotary workpiece-holding means;
   a nozzle-holding means for holding the processing liquid pouring nozzles at their home positions beside the rotary workpiece-holding means; and
   a nozzle carrying means for detachably gripping desired one of the processing liquid pouring nozzles held on the nozzle-holding means, and carrying the desired processing liquid pouring nozzle to a working position above the substrate;
   wherein the processing liquid pouring nozzles are held in alignment with straight lines extending between the center of the rotary workpiece-holding means about which the rotary workpiece-holding means rotates and a plurality of nozzle holding openings formed at suitable intervals in the nozzle-holding means, respectively, flexible supply tubes connecting the processing liquid pouring nozzles to processing liquid sources are arranged on extensions of the straight lines, respectively, and each processing liquid pouring nozzle and the supply tube connected to the processing liquid pouring nozzle move along the straight line when the nozzle carrying means carries the processing liquid pouring nozzle; and
   wherein the nozzle-holding means includes horizontal movement inhibiting members that engage with the opposite side surfaces of the processing liquid pouring nozzles, and each of the processing liquid pouring nozzles has vertical movement inhibiting projections that engage with the opposite ends of the horizontal movement inhibiting member.

2. The substrate processing apparatus according to claim 1, wherein each of the processing liquid pouring nozzles has a block-shaped nozzle head connected to the supply tube, and a nozzle tip attached to the nozzle head; and the nozzle-holding means is provided with angular position determining walls disposed adjacently to the nozzle holding openings such that sides of the nozzle heads of the processing liquid pouring nozzles are contiguous with the angular position determining walls, respectively.

3. The substrate processing apparatus according to claim 1, wherein the horizontal movement inhibiting members are provided with electromagnetic fixating members for fixedly holding the processing liquid pouring nozzles in place, and the processing liquid pouring nozzles are provided with plates at positions respectively corresponding to the electromagnetic fixating members.

4. The substrate processing apparatus according to claim 1, wherein the nozzle carrying means is movable in a horizontal plane parallel to the surface of the substrate.

5. The substrate processing apparatus according to claim 1, wherein a solvent vapor atmosphere creating space in which a solvent is stored and a solvent vapor atmosphere is produced is formed in the nozzle-holding means so as to communicate with the nozzle holding openings of the nozzle-holding means, the lower end of a drain line connected to the nozzle holding openings and extending downward is disposed in a sump formed in the bottom wall of a drain/exhaust duct, and drained liquid flowing through the drain line and overflowing the sump is discharged.

6. The substrate processing apparatus according to claim 5, wherein the drain/exhaust duct is connected to a discharge port formed in the bottom of a vessel surrounding a space extending around and under the rotary workpiece-holding means, and the bottom of the drain/exhaust passage is sloped.

7. The substrate processing apparatus according to claim 1, wherein the nozzle carrying means is movable in vertical direction.

8. A substrate processing apparatus comprising:
   a rotary workpiece-holding means for holding and rotating a substrate;
   a plurality of processing liquid pouring nozzles for pouring processing liquids on a surface of the substrate held by the rotary workpiece-holding means;
   a nozzle-holding means for holding the processing liquid pouring nozzles at their home positions beside the rotary workpiece-holding means; and
   a nozzle carrying means for detachably gripping desired one of the processing liquid pouring nozzles held on the nozzle-holding means, and carrying the desired processing liquid pouring nozzle to a working position above the substrate;
   wherein the processing liquid pouring nozzles are held in alignment with straight lines extending between the center of the rotary workpiece-holding means about which the rotary workpiece-holding means rotates and a plurality of nozzle holding openings formed at suitable intervals in the nozzle-holding means, respectively, flexible supply tubes connecting the processing liquid pouring nozzles to processing liquid sources are arranged on extensions of the straight lines, respectively, and each processing liquid pouring nozzle and the supply tube connected to the processing liquid pouring nozzle move along the straight line when the nozzle carrying means carries the processing liquid pouring nozzle, and
   wherein the processing liquid pouring nozzles are provided in their upper surfaces with a gripping recess with which a gripper included in the nozzle carrying means is able to engage, and a positioning recess with which a positioning pin attached to the nozzle carrying means at a position adjacent to the gripper is able to engage.

9. The substrate processing apparatus according to claim 8, wherein the gripping recesses and the positioning recesses of the processing liquid pouring nozzles are formed such that lines connecting the gripping recesses and the positioning recesses are parallel to each other.

10. A substrate processing apparatus comprising:
a rotary workpiece-holding means for holding and rotating a substrate;
a plurality of processing liquid pouring nozzles for pouring processing liquids on a surface of the substrate held by the rotary workpiece-holding means;
a nozzle-holding means for holding the processing liquid pouring nozzles at their home positions beside the rotary workpiece-holding means; and
a nozzle carrying means for detachably gripping desired one of the processing liquid pouring nozzles held on the nozzle-holding means, and carrying the desired processing liquid pouring nozzle to a working position above the substrate;
wherein the processing liquid pouring nozzles are held in alignment with straight lines extending between the center of the rotary workpiece-holding means about which the rotary workpiece-holding means rotates and a plurality of nozzle holding openings formed at suitable intervals in the nozzle-holding means, respectively, flexible supply tubes connecting the processing liquid pouring nozzles to processing liquid sources are arranged on extensions of the straight lines, respectively, and each processing liquid pouring nozzle and the supply tube connected to the processing liquid pouring nozzle move along the straight line when the nozzle carrying means carries the processing liquid pouring nozzle, and
wherein the nozzle-holding means is provided with electromagnetic fixating members for fixedly holding the processing liquid pouring nozzles in a substantially radial arrangement.

11. A substrate processing apparatus comprising:
a rotary holding means for holding and rotating a substrate to be processed;
a plurality of processing liquid pouring nozzles for pouring processing liquids on a surface of the substrate held by the rotary holding means;
a nozzle-holding means for holding the processing liquid pouring nozzles at their home positions beside the rotary holding means in a substantially radial arrangement in alignment with radial lines extending at predetermined angular intervals from the center of the rotary holding means; and
a nozzle carrying means for detachably gripping desired one of the processing liquid pouring nozzles held on the nozzle-holding means, and carrying the desired processing liquid pouring nozzle to a working position above the center of the substrate;
wherein the nozzle carrying means includes a gripper for gripping the processing liquid pouring nozzle, and a positioning pin disposed near the gripper; and
each of the processing liquid pouring nozzle has a block-shaped nozzle head connected to a processing liquid supply tube and provided in its top surface with a gripper receiving hole in which the gripper of the nozzle carrying means engages detachably and a positioning hole formed such that the positioning pin of the nozzle carrying means engages when the gripper engages in the gripper receiving hole;
the positioning pin engages in the positioning hole of the processing liquid pouring nozzle held at the home position on the nozzle-holding means when the gripper engages in the gripper receiving hole of the same processing liquid pouring nozzle; and
the nozzle carrying means engages the gripper and the positioning pin in the gripper receiving hole and the positioning hole of the processing liquid pouring nozzle and carries the processing liquid pouring nozzle along the radial line to the working position above the center of the substrate without changing the angular position of the processing liquid pouring nozzle.

12. The substrate processing apparatus according to claim 11, wherein the gripper and the positioning pin are arranged on a straight line, the gripper receiving hole and the positioning hole of each processing liquid pouring nozzle are arranged on a straight line, the straight lines on which the respective gripper receiving holes and the respective positioning holes of the processing liquid pouring nozzles are extended parallel to each other at predetermined intervals when the processing liquid pouring nozzles are held at the home positions in the substantially radial arrangement on the holding means, the respective positions of the positioning holes with respect to the corresponding gripper receiving holes of the processing liquid pouring nozzles are different from each other, and the positioning pin of the nozzle carrying means is able to engage in the positioning hole of any one of the processing liquid pouring nozzles.

13. The substrate processing apparatus according to claim 11, wherein the gripper capable of engaging in the gripper receiving hole has a cylindrical body provided in its lower part with a plurality of radial through holes, and a plurality of spherical members placed in the radial through holes so as to be protruded from and retracted into the radial through holes, respectively.

14. The substrate processing apparatus according to claim 11, wherein each of the processing liquid pouring nozzles has a block-shaped nozzle head connected to the supply tube, and a nozzle tip attached to the nozzle head; and the nozzle-holding means is provided with angular position determining walls disposed adjacently to the nozzle holding openings such that sides of the nozzle heads of the processing liquid pouring nozzles are contiguous with the angular position determining walls, respectively.

15. The substrate processing apparatus according to claim 11, wherein the nozzle-holding means includes horizontal movement inhibiting members that engage with the opposite side surfaces of the processing liquid pouring nozzles, and each of the processing liquid pouring nozzles has vertical movement inhibiting projections that engage with the opposite ends of the horizontal movement inhibiting member.

16. The substrate processing apparatus according to claim 15, wherein the horizontal movement inhibiting members are provided with electromagnetic fixating members for fixedly holding the processing liquid pouring nozzles in place, and the processing liquid pouring nozzles are provided with plates at positions respectively corresponding to the electromagnetic fixating members.

17. The substrate processing apparatus according to claim 11, wherein the nozzle carrying means is movable in optional directions in a horizontal plane parallel to the surface of the substrate and in vertical directions.

18. The substrate processing apparatus according to claim 11, wherein the nozzle-holding means is provided with electromagnetic fixating members for fixedly holding the processing liquid pouring nozzles in a substantially radial arrangement.

* * * * *